United States Patent [19]
Chiu et al.

[11] Patent Number: 6,144,325
[45] Date of Patent: *Nov. 7, 2000

[54] REGISTER FILE ARRAY HAVING A TWO-BIT TO FOUR-BIT ENCODER

[75] Inventors: Tom Tien-Cheng Chiu; Donald George Mikan, Jr., both of Austin; Jeffrey Tuan Anh Nguyen, Round Rock, all of Tex.

[73] Assignee: International Business Machines Corporation, Armonk, N.Y.

[*] Notice: This patent issued on a continued prosecution application filed under 37 CFR 1.53(d), and is subject to the twenty year patent term provisions of 35 U.S.C. 154(a)(2).

[21] Appl. No.: 08/772,215

[22] Filed: Dec. 20, 1996

[51] Int. Cl.[7] .............................. H03M 7/20; H03M 7/00
[52] U.S. Cl. ............................................. 341/102; 341/95
[58] Field of Search ....................... 341/95, 102; 365/51, 365/63, 154; 340/146.2; 710/26; 326/106

[56] References Cited

U.S. PATENT DOCUMENTS

| | | | |
|---|---|---|---|
| 3,239,832 | 3/1966 | Renard | 341/102 |
| 3,631,465 | 12/1971 | Heeren | 341/102 |
| 3,706,985 | 12/1972 | Darmon et al. | 341/102 |
| 4,176,287 | 11/1979 | Remedi | 307/251 |
| 4,914,655 | 4/1990 | Johannes et al. | 370/112 |
| 5,089,992 | 2/1992 | Shinohara | 365/51 |
| 5,091,907 | 2/1992 | Wettengel | 370/102 |
| 5,165,039 | 11/1992 | Niehaus et al. | 395/800 |
| 5,224,071 | 6/1993 | O'Connell et al. | 326/106 X |
| 5,327,541 | 7/1994 | Reinecke et al. | 395/400 |
| 5,369,621 | 11/1994 | Mason | 326/106 X |
| 5,428,811 | 6/1995 | Hinton et al. | 395/800 |
| 5,459,845 | 10/1995 | Nguyen et al. | 395/375 |
| 5,493,524 | 2/1996 | Guttag et al. | 364/786 |
| 5,530,822 | 6/1996 | Beavers et al. | 395/417 |

OTHER PUBLICATIONS

H. Troy Nagle, Jr. et al., "An Introduction to Computer Logic,"Prentice–Hall, Inc., Englewood Cliffs, N, pp. 98–99, 1975.

*Primary Examiner*—Patrick Wamsley
*Attorney, Agent, or Firm*—Kelly K. Kordzik; Winstead Sechrest & Minick P.C.; Anthony V. S. England

[57] ABSTRACT

A register file array for storing or outputting binary logic bits of information encoded in 2B format is disclosed. The array includes an integrated 2B encoder which encodes stored information in 2B format before access by a read port to provide 2B formatted output without significantly affecting memory access time.

11 Claims, 5 Drawing Sheets

2 BIT TO 4 BIT ENCODING

| INPUT BITS | | | OUTPUT BITS | | | |
|---|---|---|---|---|---|---|
| WD1 | WD0 | | A3 | A2 | A1 | A0 |
| 0 | 0 | ⟶ | 0 | 0 | 0 | 1 |
| 0 | 1 | ⟶ | 0 | 0 | 1 | 0 |
| 1 | 0 | ⟶ | 0 | 1 | 0 | 0 |
| 1 | 1 | ⟶ | 1 | 0 | 0 | 0 |

FIG - 2

REGISTER FILE ARRAY HAVING A TWO-BIT TO FOUR-BIT ENCODER

TECHNICAL FIELD OF THE INVENTION

The present invention relates to information handling systems and, in particular, memory arrays for storing or outputting information in an information handling system.

BACKGROUND OF THE INVENTION

The design of a typical information handling system requires the use of various types of memory array for storing or outputting information in the information handling system. For example, one type of memory array utilized in an information handling system is a register file array.

Conventional memory arrays or register file arrays utilize inputs and outputs which are in binary logic format, i.e., not encoded into any special format. These conventional memory arrays do not output specially encoded formats.

Other encoding schemes for use within an information handling system have been developed to decrease overall power consumption and increase noise margin. In particular, an encoded scheme for mapping two bits to four bits wherein only one of the four bits is "on" or in a high state (logical "1" as opposed to "0") at any given time has been developed. This encoding scheme is referred to as 2B encoding and information which has been encoded is referred to as being in 2B encoded format.

What is needed is a memory array or register file array which outputs information in 2B encoded format.

SUMMARY OF THE INVENTION

Accordingly, the present invention is directed to a memory array comprising memory cells for storing or outputting binary logic bits of information and circuitry for encoding a set of the binary logic bits into a corresponding encoded set wherein only one bit of the encoded set has a predefined logic state.

The present invention is also directed toward an information handling system comprising memory cells for storing or outputting binary logic bits of information and circuitry for encoding a set of the binary logic bits into a corresponding encoded set wherein only one bit of the encoded set has a predefined logic state.

The primary advantage of the present invention is the provision of a memory array or register file array which outputs information in the 2B encoded format. The present invention accomplishes the above without significantly increasing the memory access time of the memory array.

BRIEF DESCRIPTION OF THE DRAWINGS

FIG. 2 illustrates the two-bit to four-bit encoding scheme utilized in the present invention.

DETAILED DESCRIPTION OF A PREFERRED EMBODIMENT OF THE INVENTION

Generally, the present invention provides memory arrays for storing or outputting binary logic bits of information. The memory array of the present invention includes circuitry specifically designed to output stored information in 2B encoded format.

Figure 1:
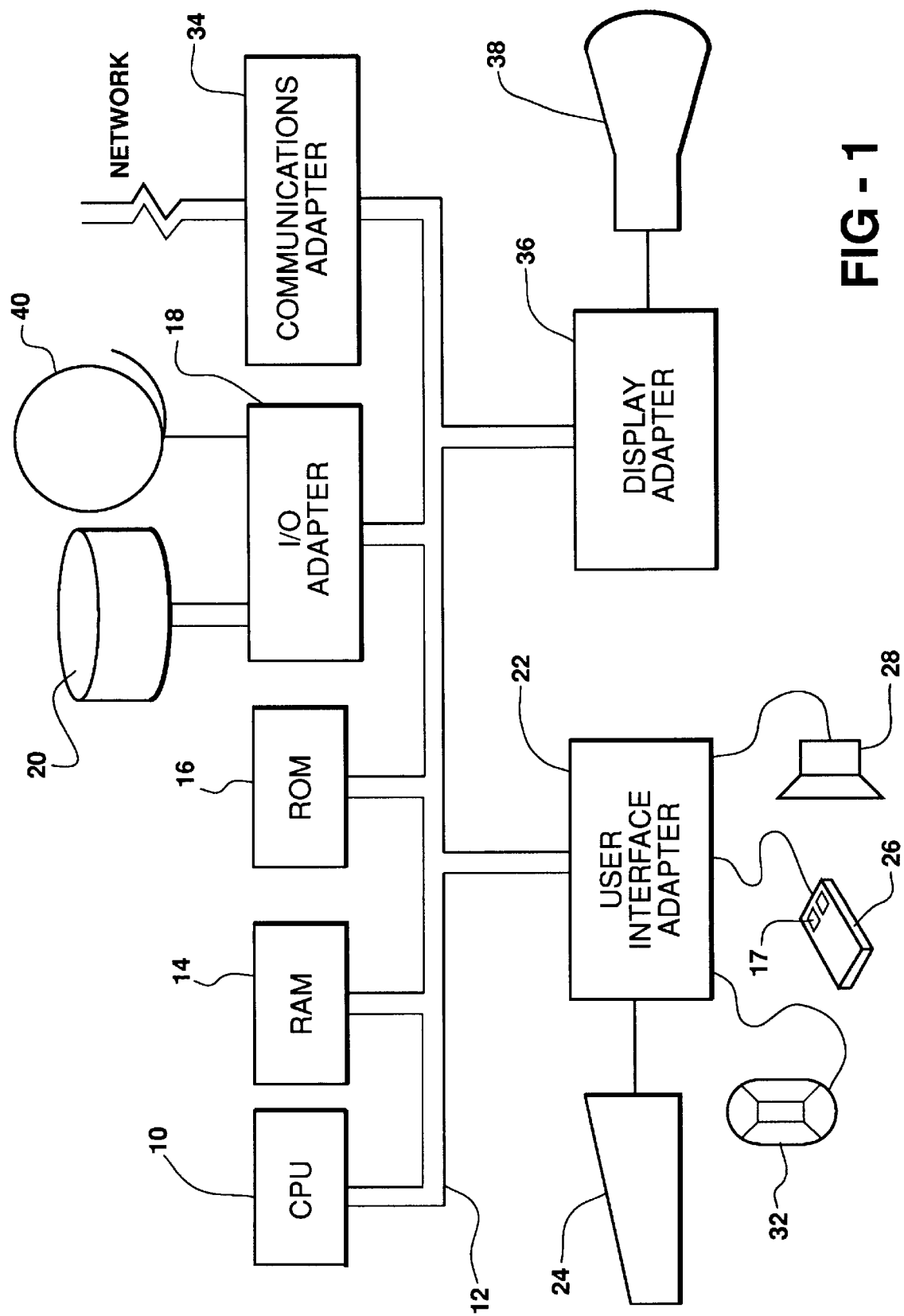
FIG. 1 is an information handling system embodying the present invention.

Referring now to FIG. 1, a representative hardware environment for practicing the present invention is depicted and illustrates a typical hardware configuration of a computer or information handling system in accordance with the subject invention, having at least one central processing unit (CPU) 10. CPU 10 is interconnected via system bus 12 to random access memory (RAM) 14, read only memory (ROM) 16, and input/output (I/O) adapter 18 for connecting peripheral devices such as disc units 20 and tape drives 40 to bus 12, user interface adapter 22 for connecting keyboard 24, mouse 26 having button 17, speaker 28, microphone 32, and/or other user interfaced devices such as a touch screen device (not shown) to bus 12, communication adapter 34 for connecting the information handling system to a data processing network, and display adapter 36 for connecting bus 12 to display device 38.

The present invention is preferably implemented as part of CPU 10. Specifically, the memory array of the present invention is designed to output information encoded according to the encoding scheme illustrated in FIG. 2.

Referring to FIG. 2, a two-bit to four-bit encoding scheme referred to as 2B encoding is shown, wherein information in the form of a signal having two bits, WD0 and WD1, is encoded to a signal having the four bits, A0, A1, A2, and A3. FIG. 2 provides only one example to illustrate the present invention. It will be appreciated that a signal having any number of bits equal to or greater than two may be utilized with the present invention.

Figure 3:
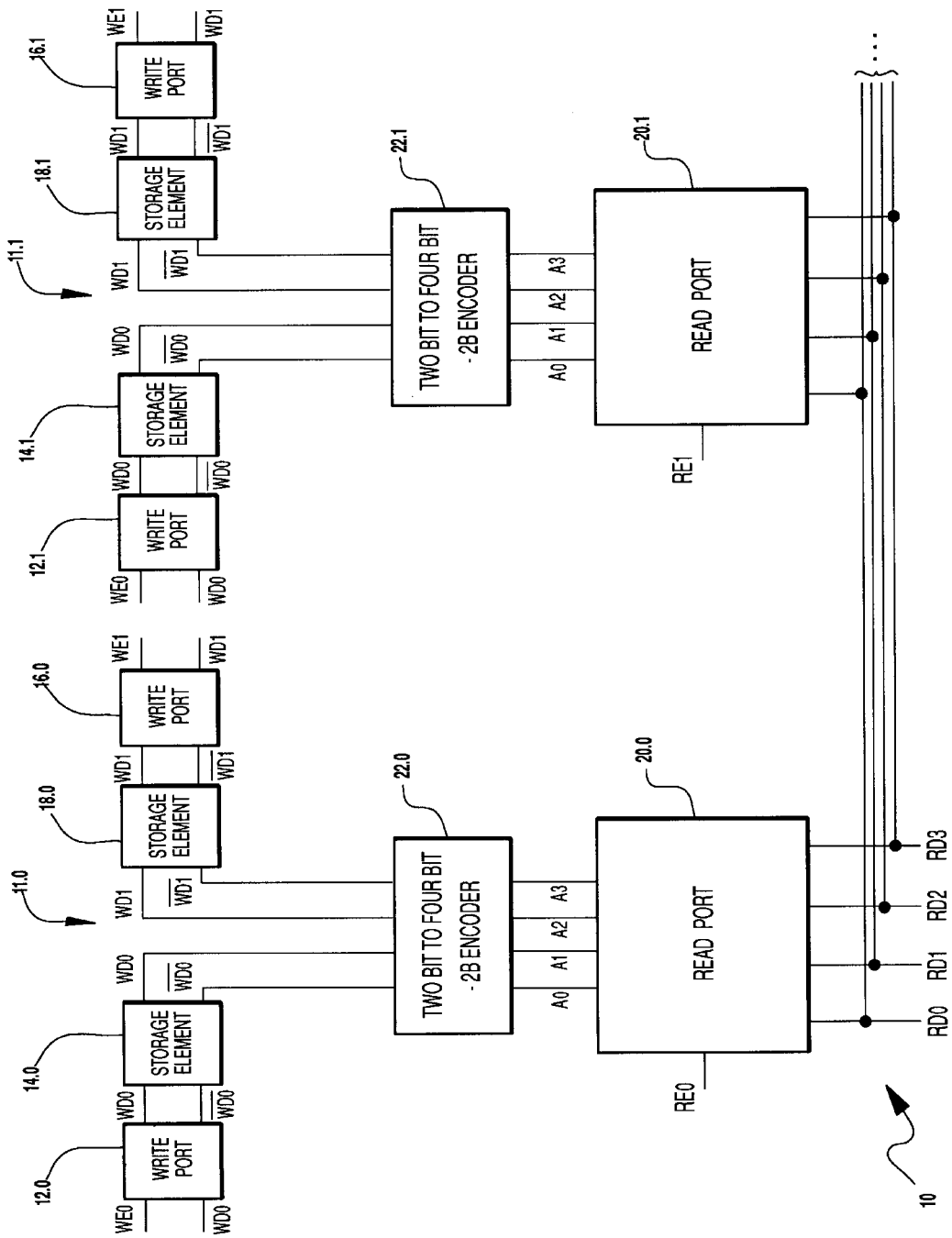
FIG. 3 is a block diagram of the preferred embodiment of the memory array of the present invention.

Referring to FIG. 3, a memory array 10 according to the present invention is shown. Memory array 10 includes a number of memory elements 11, which are operably coupled to outputs RD0, RD1, RD2, and RD3. Shown in FIG. 3 are only memory elements 11.0 and 11.1 as being typical of N+1 memory elements 11. However, it should be understood that a large number N+1 of such elements 11 may be included in array 10 and that the description following is largely applicable to the N+1 elements 11.0, 11.1, . . . 11.N.

Such a memory element includes a first write port 12. Write port 12 includes a write enable input WE0 for allowing the single data bit WD0 to be written to or stored in a memory cell or storage element 14. Write port 12 allows data bit WD0 and its complement $\overline{WD0}$ to be passed to or inputted to memory cell 14 when the write enable input WE0 is in the high state or logical 1 state. Memory element 11 further includes a second write port 16 having a write enable input WE1 and a data bit input WD1. The output of write port 16, WD1 and $\overline{WD1}$, is passed to and stored in a second memory cell or storage element 18. Second write port 16 allows data bit WD1 to be stored in or passed to second memory cell 18 when the write enable input WE1 is in the high state or logical 1 state. Memory element 11 further includes a read access port 20 for accessing the binary logic bits from memory cells 14 and 18.

Read access port 20 includes a read enable input RE which controls passage or transference of input bits A0, A1, A2, A3 to outputs RD0, RD1, RD2, and RD3. When the read enable RE input to read access port 20 is in the high, active, or logical 1 state, the outputs of read access port 20 RD0 through RD3 read the inputs A0 through A3 of the read access port 20, and the inputs A0 through A3 are transferred or passed to the outputs RD0 through RD3. The time from which the read enable input is set into or placed into the high, active, or logical 1 state until the inputs A0 through A3 appear at the outputs RD0 through RD3 is known as the memory access time.

According to the present invention, the outputted information from read access port 20, RD0 through RD3, is required to be in 2B encoded format. To meet this requirement, the present invention provides a two-bit to four-bit encoder, 2B encoder 22, coupled to the outputs of memory cells 14 and 18 and the inputs of read access port 20 A0 through A3. Encoder 22 has as inputs bits WD0, $\overline{WD0}$, WD1, and $\overline{WD1}$ and as outputs bits A0, A1, A2, and A3. Encoder 22 maps bits WD0, WD1 into bits A0, A1, A2, and A3 according to the encoding scheme set forth in FIG. 2. For example, if bits WD0 and WD1 are 0 bits, bits A3, A2, and A1 will be 0 and bit A0 will be 1.

Because there is an encoder 22.0, 22.1, etc., interposed between the storage elements associated with each read port 20.0, 20.1, etc., the binary logic bits stored in memory cells 14 and 18, WD0 and WD1, are encoded into 2B format bits A0 through A3 independently of access by any of the read ports 20. Thus when any read port 20 access is triggered by a read enable input RE, the data in storage element 14 and 18 have already been encoded by encoder 22 so that no delay is added to convert from binary format to 2B encoded format during memory access time.

It will be appreciated that although only two memory cells are shown, the present invention is equally applicable to any number of memory cells, write ports, read ports, or two-bit to four-bit encoders. It will also be appreciated that the embodiment shown and described in connection with FIG. 3 is the preferred embodiment of the invention, since the memory array provides the output of 2B encoded formatted information without significantly increasing the memory access time of the memory array.

Figure 4:
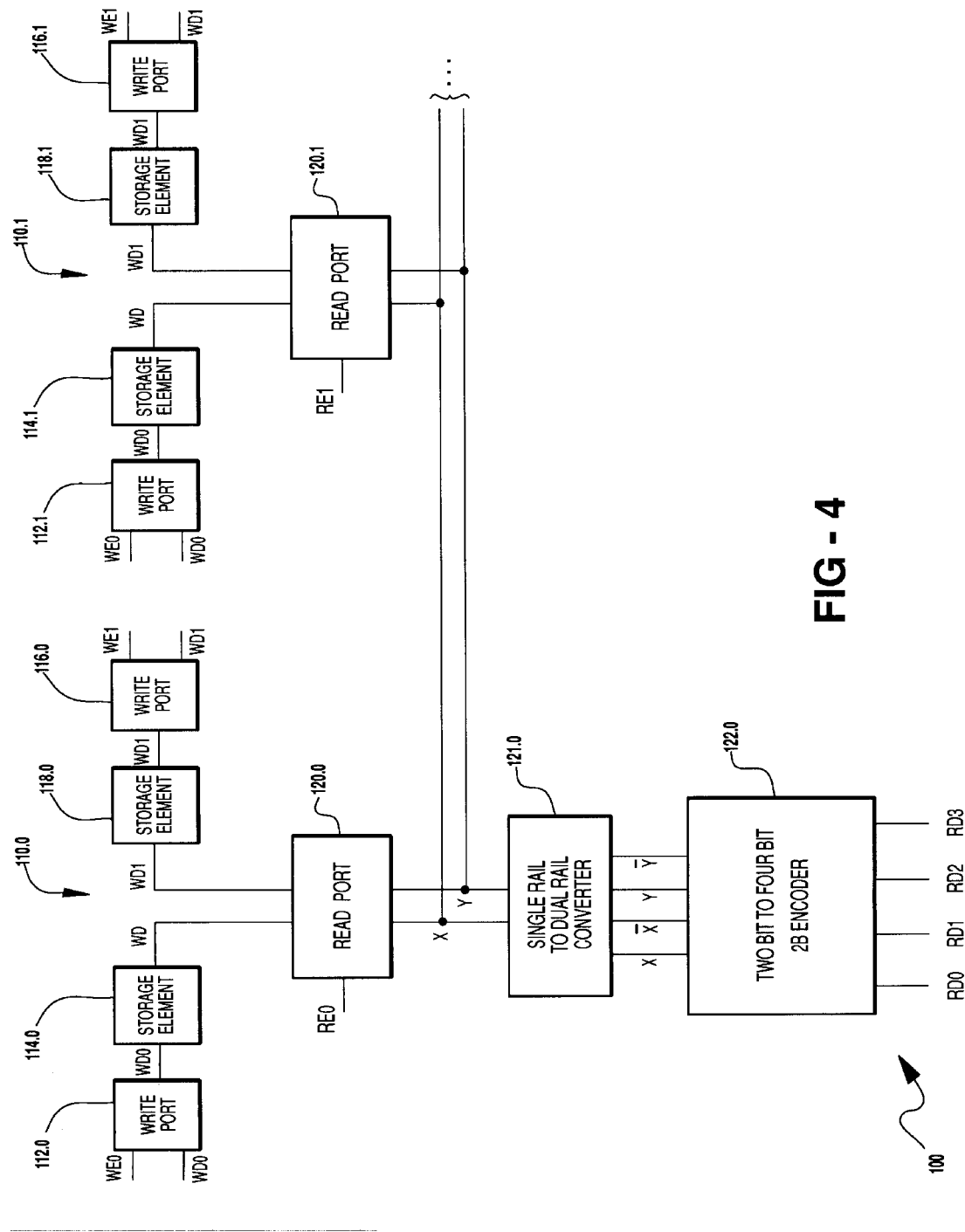
FIG. 4 is a block diagram of an alternative memory array.

Referring now to FIG. 4, an alternative configuration of circuitry for a memory array 100 is shown. A typical memory element 110 of FIG. 4 has the same inputs, namely, WE0, WE1, WD0, WD1, RE, and outputs RD0 through RD3, as memory element 11 of FIG. 3. First write port 112, first memory cell 114, second write port 116, and second memory cell 118 pass data bits WD0 and WD1 to read access port 120 as inputs to read access port 120. Here, it is noted that the complements of data bits WD0 and WD1 are not needed, since the data bits are not directly inputted into the two-bit to four-bit encoder, but instead are directly inputted into the read access port 120. The output of read access port 120 is bits X and Y. Read access port 120 of FIG. 4 is controlled in a similar fashion as read access port 20 of FIG. 3 by read enable input RE.

Output bits X and Y from any of the enabled read ports 120.0, 120.1, etc. are inputted into a single rail to dual rail convertor 121. The output of single rail to dual rail convertor 121 is the true and complement of bits X and Y, or in other words, bits X, $\overline{X}$, Y and $\overline{Y}$. Bits X, $\overline{X}$, Y, and $\overline{Y}$ are inputted into two-bit to four-bit encoder or 2B encoder 122, and the output of encoder 122 is bits RD0 through RD3 encoded in 2B format.

In this alternative circuitry for memory array 100, only a single encoder 122 is required. Ordinarily this would be considered advantageous because of savings in layout space, power, device count, etc. However, in the circuitry of memory array 100, memory access time is significantly increased due to the delay introduced by the single rail to dual rail convertor 121 and encoder 122 after the read enable input is brought high or active to provide access to 2B encoded format bits RD0 through RD3. Therefore, the circuitry of memory array 10 in FIG. 3 is preferred.

Moreover, it is to be noted that only one of the four bits ouputted from encoder 22 is in the high state or on state (i.e., logical 1) at any one time which mitigates the increase in power associated with an increased number of encoders.

Figure 5:
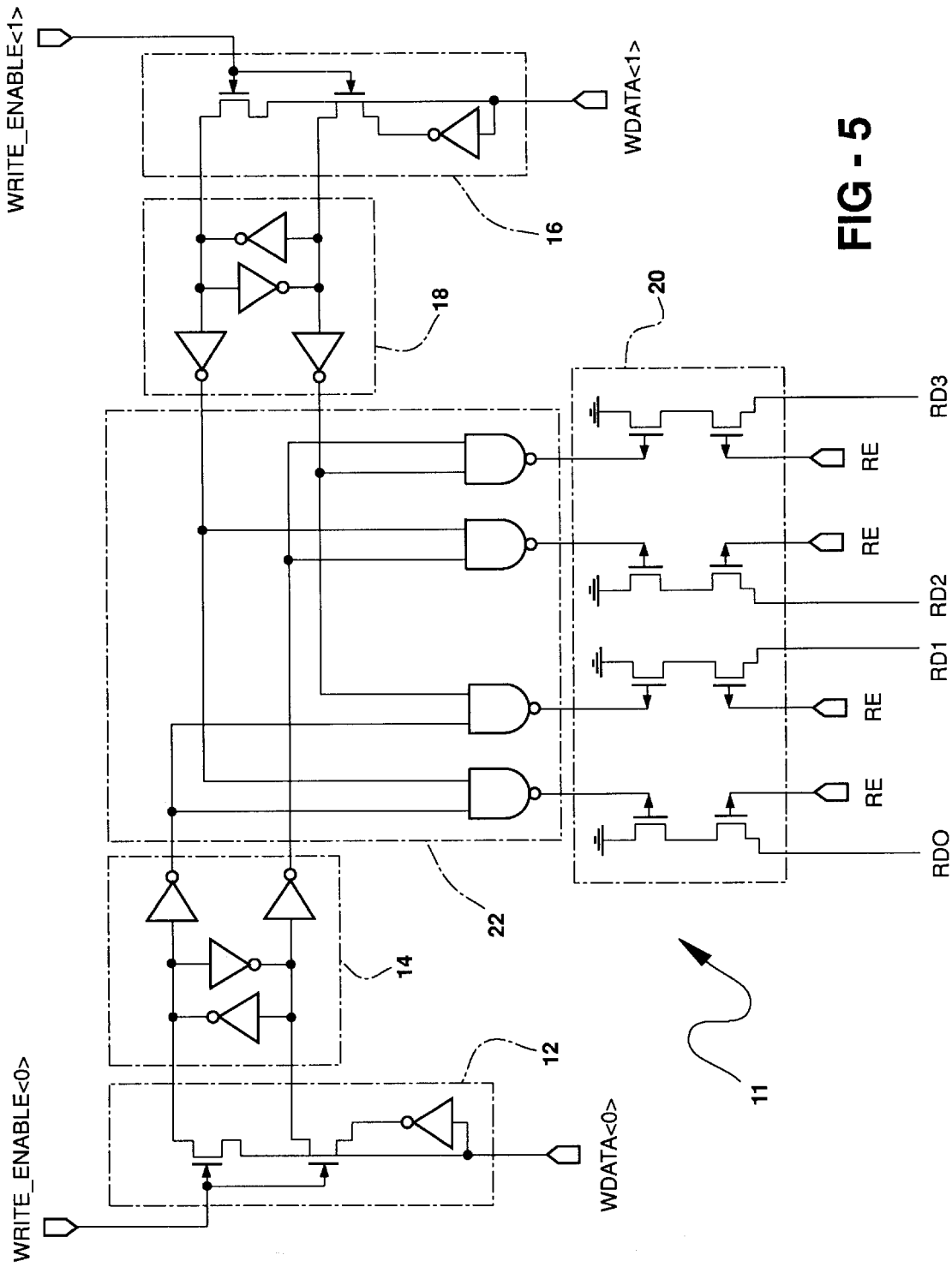
FIG. 5 illustrates details of a memory element of the memory array of FIG. 3.

Referring now to FIG. 5, details are shown for the circuitry of memory element of FIG. 3.

Although the present invention and its advantages have been described in detail, it should be understood that various changes, substitutions and alterations can be made herein without departing from the spirit or scope of the invention as defined in the appended claims.

What is claimed is:

1. A memory element comprising:
   a first storage element for storing a first bit and its complement;
   a second storage element, separate from the first storage element, for storing a second bit and its complement;
   a first write port coupled to the first storage element for (i) receiving the first bit and a first write enable signal, (ii) producing, the complement of the first bit, and (iii) writing, the first bit and its complement into the first storage element in response to the first write enable signal;
   a second write port coupled to the second storage element for (i) receiving the second bit and a second write enable signal, (ii) producing the complement of the second bit, and (iii) writing the second bit and its complement into the second storage element in response to the second write enable signal;
   an encoder, coupled to the first and second storage elements, for encoding, the first and second bits and their complements stored in the storage elements into an encoded representation, wherein the encoded representation is produced by the encoder within the same clock cycle as the storage of the first and second bits into the first and second storage elements; and
   a read port coupled to the encoder for reading the encoded representation in response to a read enable signal.

2. The memory element as recited in claim 1, wherein the encoded representation is a 2B representation of the first and second bits.

3. The memory element as recited in claim 1, wherein the encoder is a 2-bit to 4-bit encoder, wherein only one of the four outputs of the encoder is asserted at a time.

4. The memory element as recited in claim 1, wherein the encoder is coupled between the storage elements and the read port.

5. The memory element as recited in claim 1, wherein the encoder further comprises:
   a first NAND gate receiving the first and second bits;
   a second NAND gate receiving the complements of the first and second bits;
   a third NAND gate receiving the first bit and the complement of the second bit, and
   a fourth NAND gate receiving the second bit and the complement of the first bit, wherein outputs of the NAND gates are coupled to the read port.

6. A method comprising, the steps of:
   writing a first bit and its complement into a first storage element in response to a first write enable signal;
   writing, a second bit and its complement into a second storage element in response to a second write enable signal, wherein the first storage element is separate from the second storage element;
   encoding the first and second bits and their complements stored in the storage elements into an encoded representation wherein the encoding step occurs within the same clock cycle as the writing steps; and reading out the encoded representation in response to a read enable signal.

7. The method as recited in claim 6, wherein the encoded representation is a 2B representation of the first and second bits.

8. The method as recited in claim 6, wherein the encoding step further comprises the step of converting the first and second bits into four output bits, wherein only one of the four output bits is asserted at a time.

9. A memory array comprising a plurality of memory cells, the memory array further comprising:

a first write port for receiving a first bit;

a first one of the plurality of memory cells for receiving the first bit from the first write port;

a second write port for receiving, a second bit;

a second one of the plurality of memory cells for receiving the second bit from the second write port;

a first encoder for receiving the first and second bits and outputting a first encoded representation;

a first read port for reading the first encoded representation to a first read output;

a third write port for receiving a third bit;

a third one of the plurality of memory cells for receiving the third bit from the third write port;

a fourth write port for receiving a fourth bit;

a fourth one of the plurality of memory cells for receiving, the fourth bit from the fourth write port;

a second encoder for receiving the third and fourth bits and outputting a second encoded representation;

a second read port for reading the second encoded representation to a second read output; and an output of the memory array, wherein the first and second read outputs are coupled to the output of the memory array.

10. The memory array as recited in claim 9, wherein the first and second read outputs are coupled to the output of the memory array in a manner where either the first or second encoded representation can be output to the output of the memory array.

11. The memory array as recited in claim 9 wherein the plurality of memory cells comprises more than six memory cells, wherein a separate encoder is coupled to every two memory cells.

* * * * *